United States Patent
Erstad

(10) Patent No.: US 6,794,908 B2
(45) Date of Patent: Sep. 21, 2004

(54) RADIATION-HARD CIRCUIT

(75) Inventor: David O. Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/452,557

(22) Filed: May 30, 2003

(65) Prior Publication Data
US 2004/0022005 A1 Feb. 5, 2004

Related U.S. Application Data
(60) Provisional application No. 60/384,585, filed on May 31, 2002.

(51) Int. Cl.[7] ................................................. H03B 1/00
(52) U.S. Cl. ....................................... 327/112; 327/537
(58) Field of Search ................................. 327/108, 112, 327/427, 436, 437, 534, 537, 581, 576, 566, 206; 326/9, 10, 13, 83, 271, 102–104; 257/369, 371

(56) References Cited

U.S. PATENT DOCUMENTS

| 4,189,785 A | 2/1980 | Rapp ............................ 365/156 |
| 4,782,467 A | 11/1988 | Belt et al. .................... 365/154 |
| 4,805,148 A | 2/1989 | Diehl-Nagle et al. ....... 365/154 |
| 5,175,605 A | 12/1992 | Pavlu et al. ................. 257/369 |
| 5,220,192 A | 6/1993 | Owens et al. ............... 257/519 |
| 5,406,513 A | 4/1995 | Canaris et al. .............. 365/181 |
| 5,631,863 A | 5/1997 | Fechner et al. ............. 365/156 |
| 5,644,266 A * | 7/1997 | Chen et al. .................. 327/534 |
| 6,058,041 A | 5/2000 | Golke et al. ................. 365/156 |
| 6,094,068 A * | 7/2000 | Nomura et al. ............... 326/83 |
| 6,278,287 B1 * | 8/2001 | Baze .............................. 326/9 |
| 6,326,809 B1 | 12/2001 | Gambles et al. .............. 326/46 |
| 6,356,101 B1 | 3/2002 | Erstad .......................... 326/27 |
| 2002/0017924 A1 | 2/2002 | Knowles ..................... 326/119 |

* cited by examiner

Primary Examiner—Long Nguyen
(74) Attorney, Agent, or Firm—McDonnell Boehnen Hulbert & Berghoff LLP

(57) ABSTRACT

A radiation hardening circuit that includes two series-connected transistors that can replace any single transistor in a circuit. The hardening circuit includes a resistor that has a first node and a second node, a first transistor having a source terminal, a gate terminal, a drain terminal, and a body terminal. The first node of the resistor may be conductively connected to the drain terminal of the first transistor and the second node of the resistor is conductively connected to the body terminal of the first transistor. The hardening circuit also includes a second transistor in series with the first transistor, driven so that both transistors are off or on at any given time. The circuit is resistant to radiation-induced events due to the body bias of the first transistor, the off state of the second transistor, and the current limiting effect of the resistor.

15 Claims, 3 Drawing Sheets

RADIATION-HARD CIRCUIT

This application claims the benefit of U.S. Provisional Application No. 60/384,585, filed May 31, 2002, which is hereby fully incorporated by reference.

BACKGROUND

1. Field of the Invention

The present invention relates to microelectronic circuits and, more particularly, to single-event effect (SEE) resistant or "rad-hard" circuits.

2. Description of Related Art

Integrated circuits used in space, weapons, or aviation applications must be more resistant to radiation than circuits used in other applications, because they are more likely to be exposed to radiation, and because their reliability is often more critical. Such solid-state circuits are vulnerable to transient disturbance of the output voltage state from particles that pass through transistors or other circuit elements. These disturbances can result in operational failure of the circuit. Some examples of these particles are:

- Alpha particles: These are the byproducts of the natural decay of elements.
- Energetic (having kinetic energy) protons, neutrons, electrons, and all the natural elements. These are abundant in intergalactic space, earth orbital space and even at high atmospheric altitudes (e.g., commercial flight altitudes) in a wide range of energies.

When a particle passes through a transistor (or any device), hole-electron pairs are created along the track length. The electrons will migrate toward high voltage state nodes of the struck transistor, resulting in a discharging current on that node. If the discharging current exceeds the current drive of the transistor holding the high voltage state on that node, the node will transition to the undesired low state. The holes will migrate toward low voltage state nodes of the struck transistor resulting in a charging current on that node. If the charging current exceeds the current drive of the transistor holding the low voltage state on that node, the node will transition to the undesired high state. The number of hole-electron pairs created by the particle is finite, so the node voltage disturbance is temporary. The result is that a particle can cause a transient disturbance of the output node of a logic gate. The density of these particles is small—small enough that these disturbances are treated as singular events in time. Thus, a transient disturbance caused by a particle strike is known as a single-event transient (SET).

A circuit node will return to the desired voltage state after a SET. Thus, a SET, in and of itself, is not a problem. What is a problem is the consequence of having a temporary voltage disturbance on a circuit node. If the node is in a clock network, the SET can generate a false clock pulse in a portion of the system. If the node is in a data storage element, the SET can flip the stored bit to the opposite state. If the node is in the logic that feeds the data input to a latch (or flip-flop, register, etc.), there may or may not be a consequence from the SET. If the data input recovers to the valid state from a SET before the latch closes, there is no consequence. However, if the data input does not recover to the valid state from a SET before the latch closes, then the wrong data state is loaded into the latch. When the SET results in the wrong data state in a closed data storage element, it is known as a single-event upset (SEU). More generally, logic errors caused by SETs are known as single-event effects. The susceptibility of modern integrated circuits to single-event effects is heightened by the reduced feature size and higher clock speeds that are otherwise very desirable.

Some solutions attempting to mitigate SEU susceptibility require the use of relatively complex combinational logic circuitry to provide logical or temporal isolation of single-event effects that would otherwise cause errors, but such solutions typically are not area efficient.

Further, logic and temporal isolation circuit solutions can affect overall circuit speed and may, in some cases, be applicable only to storage circuits. Thus, an area-efficient solution that provides a high degree of SEU hardness and that is also applicable to various circuit types (such as combinational logic circuits as well as memory circuits) is needed.

SUMMARY OF THE INVENTION

In a first aspect, a radiation hardening circuit is provided, where the circuit includes a first transistor that has a source terminal, a gate terminal, a drain terminal, and a body terminal. The circuit also includes a resistor with a first node and a second node, and the first node of the resistor is conductively coupled to a reference voltage node while the second node of the resistor is conductively coupled to the body terminal of the first transistor The circuit also includes a second transistor having a source terminal, a gate terminal, a drain terminal, and a body terminal. The drain terminal of the second transistor is conductively coupled to the source terminal of the first transistor and the gate terminal of the second transistor is conductively coupled to the gate terminal of the first transistor, so that a particle strike on either of the two transistors will not result in a single-event transient.

These as well as other aspects of the present invention will become apparent to those of ordinary skill in the art by reading the following detailed description, with appropriate reference to the accompanying drawings.

BRIEF DESCRIPTION OF THE DRAWINGS

Exemplary embodiments of the present radiation-hardening circuit are described herein with reference to the drawings, in which.

DETAILED DESCRIPTION

When a particle passes through a device, a hole-electron pair creation results from the transfer of energy from the particle to the surrounding material. This is known as Linear Energy Transfer (LET), which has the units of MeV-cm2/mg. Knowing the activation energy for a hole-electron pair and the material density, LET can be converted into units of Coulombs/cm along the particle track. Thus, the particle will only create a finite amount of charge per unit distance along its track. As the energy and mass of a particle increases, its LET increases. However, every particle has a maximum LET no matter how much energy it has. Once enough energy has been added to the particle to achieve the maximum LET, the addition of more energy will result in a LET reduction. The charge that a particle creates that is collected by a device is calculated by multiplying the LET(C/cm) by the particle track length in a continuous lightly doped silicon region. That is, the charge collection along the track is truncated by oxide and degenerately doped P+ and N+ source drain regions and degenerately doped P+ and N+ body-connection regions. In addition, while a particle can travel great distances through the silicon material, there is a maximum limit to the distance along a track from which charge will be collected. This limit is generally in the range of a few to several microns.

Figure 1:
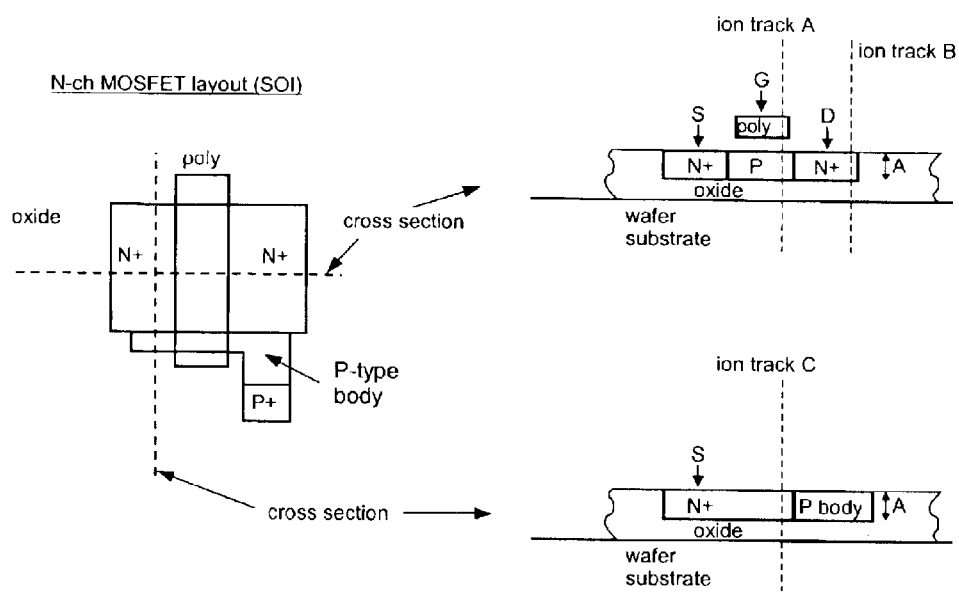
FIG. 1 is an illustration of an N-channel MOSFET layout and cross-section in silicon-on-insulator (SOI) technology.

FIG. 1 illustrates an N-Channel MOSFET in an SOI technology. An N-Channel device is shown for purposes of illustration only, and the following discussion and circuits are equally applicable in equivalent P-Channel devices and complementary circuits. Distance 'A' in FIG. 1 represents the region of ion track A from which charge is collected. The amount of charge collected from a particle strike can be greater than the charge that is created by the particle strike. Consider an "off" N-Channel MOSFET with S=B=VSS (i.e., with a source-body tie connected to VSS) and D=high (e.g., D is being held high by an on P-Channel MOSFET). There is a reverse-biased p-n junction between the drain and the gate region. When a particle passes through this junction along the particle track 'A' shown in FIG. 1, the hole-electron pairs are separated by the voltage difference between the drain and gate and charge is collected from the region along the track. A drain-discharge current is created by the collection of electrons from this portion of the track. The holes generated along this portion of the track are collected by the gate, where they then travel to the P+ connection to VSS. Traveling holes result in a current, and since the P-body region has resistance, a particle traveling along track A creates a voltage rise from the P+B=VSS connection to the location of the particle track.

If this voltage increase is large enough to forward bias the P-body-to-N+S junction under the gate oxide, the parasitic NPN bipolar junction transistor (BJT) structure (not shown) in the MOSFET is turned on between D and S. The hole current is then multiplied by the gain of the BJT, and appears as an additional discharge current on the drain. Particle tracks 'B' and 'C' in FIG. 1 do not traverse the gate region, but the charge created by them will diffuse to the nearest depletion region. As the diffusing holes and electrons reach the drain depletion region, the electrons will be collected by the drain creating a discharge current, and the holes may be repelled into the P-body, again creating the possibility of turning on the parasitic BJT.

If the particle strike is far from a critical node, the created charge may not be able to get to the critical node to cause a SET or SEU. Thus, there is a finite volume around the critical node through which a particle must pass to create a SET or SEU. This is known as the sensitive volume.

The more charge collection a circuit can tolerate before a SET or SEU results, the greater the LET it can tolerate. Increasing this tolerance is known as SEU or SET hardening. The energized particle environment contains a variety of particle types and energies that result in a wide range of LETs. The density of particles versus LET decreases as the LET increases. These particles do not have a directional dependence; they can strike from any direction. If the density of the LETs that can cause a SET or SEU and the size of the sensitive volume is known, the probability of a SET or SEU occurring can be determined. These probabilities are known as Soft Error Rates (SER). These errors are considered "soft" because they can be corrected.

Non-SEU/SET Hardened Circuit Response to a Particle Strike

Figure 2:
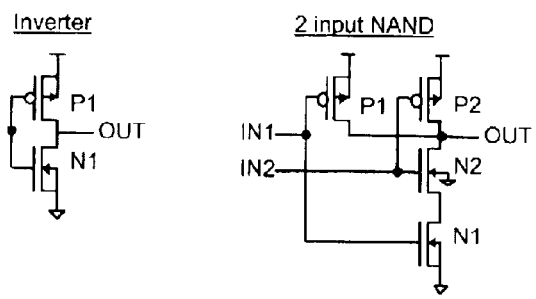
FIG. 2 is an illustration of two typical prior-art CMOS logic circuits.

FIG. 2 is a schematic of a typical non-SET/SEU hardened CMOS inverter. If IN is low, P1 is on, N1 is off, and OUT is high. A particle strike on N1 may disturb the OUT voltage state because the created charge in N1 will result in a pull-down current competing against the pull-up current of P1. If the pull-down current is sufficiently larger than the pull-up current to cause the OUT voltage to temporarily fall past the switch point of the next logic gate, then a SET induced state change pulse is propagated. If the pull-down current is large enough to reduce the OUT voltage to about VSS, this voltage will remain until P1 removes all of the created charge. A particle strike on P1 will not disturb the OUT voltage state because there are no voltage differences within P1 to cause charge movement toward OUT. Thus, none of the created charge has been removed. When IN is complemented, then the charge collection mechanism switches between the P-Channel and N-Channel transistors.

Referring now to the NAND gate of FIG. 2, if IN1 is high and IN2 is low, then P1 and N2 are off and P2 and N1 are on, and OUT is high. A particle strike on N2 creates two pull-down current paths. The first is a pull-down current path from N2 D to N2 B. The second is a pull-down current path from N2 D to N2 S if the parasitic BJT (not shown) is turned on.

If IN1 and IN2 are both low, then N1 and N2 are off and P1 and P2 are on, and OUT is high. A particle strike on N2 again creates a pull-down current from N2 D to N2 B and from N2 D to N2 S if the parasitic BJT is turned on. However, because N1 is off, the N2 D to N2 S pull-down current path is cut off from VSS. Thus, the only N2 D to N2 S pull-down current on OUT that flows is the displacement current that results from charging the capacitance on node n1. Generally, this capacitance is much smaller than the capacitance on node OUT, so this current has little effect on OUT. The net result is that only the N2 D to N2 B pull-down current results.

A single MOSFET may be replaced with a MOSFET pair by making the following connections. The gate terminals of the MOSFET pair are connected to the same node in which the single MOSFET gate terminal is connected. The source terminal of the first MOSFET pair transistor is connected to the drain terminal of the second MOSFET pair transistor. The drain terminal of the first MOSFET pair transistor is connected to the same node in which the single MOSFET drain terminal is connected. The source terminal of the second MOSFET pair transistor is connected to the same node in which the single MOSFET source terminal is connected. The body of the first MOSFET pair transistor is connected to one terminal of a conductive device, such as a resistor. The other terminal of the conductive device is connected to the drain terminal of the first MOSFET pair transistor or other node as described herein. The body of the second MOSFET pair transistor may be connected to the source terminal of the second MOSFET pair transistor or to another voltage potential in accordance with CMOS design techniques.

Figure 3:
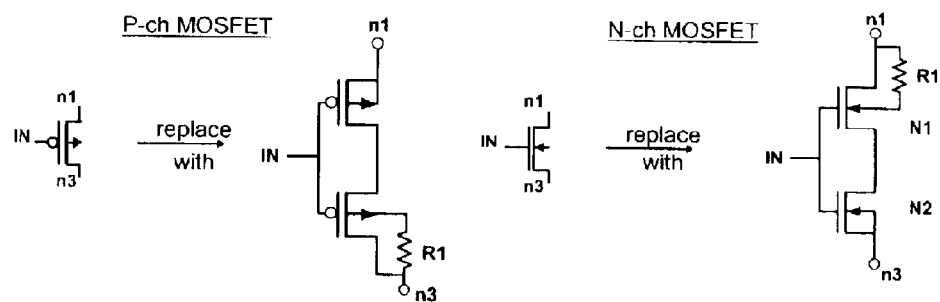
FIG. 3 shows an N-channel and a P-channel embodiment of the hardening circuit.

An embodiment of an SET hardening circuit is illustrated in FIG. 3. In the embodiments of FIG. 3, all single MOSFETs of a typical circuit (as in FIG. 2, for example) are replaced with a MOSFET pair connected as shown. These pairs can be used where Vn1 (node 1) is >=Vn3 (node 3). Alternative embodiments may be used where this voltage relationship does not apply.

With reference to FIG. 3, the following description applies to the N-Channel configuration on the right, but the same principles apply equivalently to the P-Channel configuration on the left. In the exemplary embodiment shown, the transistors are fabricated using silicon-on-insulator (SOI) process techniques, but other embodiments are possible as well. In the N-Channel hardened circuit, the body of transistor N1 is biased high by impedance device R1. This can create advantages over other body tie options, although other options are possible. Biasing the body of N1 high lowers the threshold voltage $V_T$ of the transistor, with a corresponding improvement in transient response, since N1 will have a higher drive current capability due to the lowered threshold voltage. In addition, R1 provides some base drive current to the parasitic BJT (not shown) of N1, which can also improve switching speed when N1 is driven high.

It is not necessary to all embodiments of the circuit that R1 is a linear resistor; it can be virtually any current limiting device. One embodiment is to implement R1 by layout techniques that use the inherent resistance associated with the body connection to create a resistor without a discrete device; however, R1 can also be created by any other suitable microcircuit manufacturing technique. For example, to use inherent resistivity, increasing the distance between the drain and the P+ body connection region of an N-channel MOSFET can increase the impedance of R1.

Referring back to FIG. 3, when transistor N1 is off, R1 ensures that D=B, leaving no reverse-biased junction and therefore no sensitive volume in transistor N1. Transistor N1 is thus not vulnerable (or is at least far less vulnerable) to a particle hit. The configuration of FIG. 3 also improves hardness by limiting the pull-down current that can pass through N1 if N2 sustains a particle hit. In addition to the circuit shown in FIG. 3, other configurations are possible, such as those where the body of N1 is coupled to any node that has a voltage between the drain potential and the output node potential, either directly or through an impedance.

R1 can be sized according to the requirements of the circuit. If R1 is sufficiently large, the overall circuit can be made immune to SET/SEU due to the limitation of pull-down current available through N1 when N1 and N2 are off (i.e., not driven "on" by an input signal). A relatively large value of R1 could, however, mitigate some of the performance advantages discussed for high-frequency operation. On the other hand, reducing the value of R1 will increase the (driven) transient performance of the circuit, with some reduction in SET/SEU hardness. There is a substantial range of values for R1 that may be used to achieve appropriate trade-offs in speed vs. hardness. Further, the body tie configuration of FIG. 3 can be extended to other circuits as well (e.g., transmission gate configurations), with the same results described above.

Figure 4:
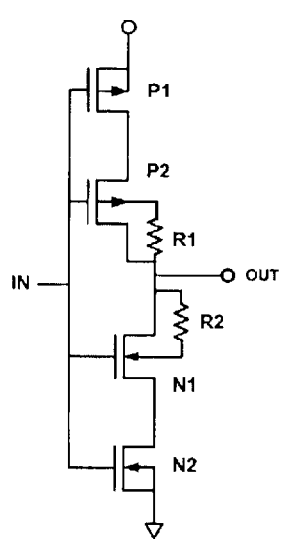
FIG. 4 is a schematic of an exemplary hardened inverter circuit.

An exemplary SET-hard circuit used in an inverter configuration is shown in FIG. 4. The operation described below also applies to insertions of two transistors in place of one (per FIG. 3) in NAND gates, NOR gates, or other circuits. The hardening technique can, in fact, be used in virtually any MOS circuit by replacing susceptible single transistors (either P-Channel or N-Channel) with two transistors, as shown in FIG. 3. With reference to FIG. 4, if IN is low, then P1 and P2 are on, N2 and N1 are off, and OUT is high. A particle strike on N1 will have little or no effect because N1 has no reverse-biased junction and N2 is off, so there is no pull-down current path to VSS. Moreover, the pull-down current that would result from a hit on N2 is limited by R2.

If IN is high, then P1 and P2 are off, N2 and N1 are on, and OUT is low. In this case, P1 and P2 provide hardness to the circuit in a manner complementary to that described above with respect to N1 and N2. More specifically, P2 has no reverse-biased junction and P1 is off, making P2 relatively immune from upsets if P2 is struck, and R1 will limit any pull-up current through P1 if P1 is struck.

Figure 5:
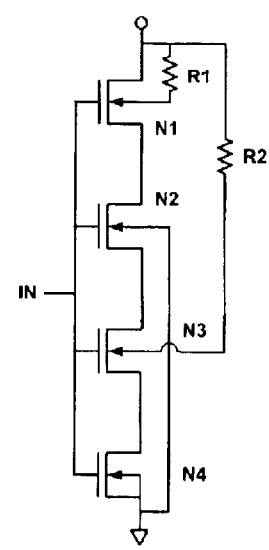
FIG. 5 is a schematic of an exemplary hardened NAND circuit.

In an alternative embodiment, the body-biasing resistor of a transistor in the circuit may be tied to a node other than the drain of the same transistor. For example, where a four-transistor N-channel stack is used to replace the two N-channel transistors in the NAND gate of FIG. 2, resistors R1 and R2 in the bottom half of the stack could be tied to the output of the NAND gate, which is also the drain of the top transistor, N1, in the N-channel stack. This alternate configuration is shown in FIG. 5. Further, the body of N2 can be connected to an alternate potential such as the source of N4 (alternate connection not shown), although it may be connected to the source of N3 even in this alternative body-biasing embodiment. Virtually any combination of body tie configurations is possible, depending on the needs of the circuit being hardened. Thus, it is possibly for one transistor in a circuit to have a body tie to another terminal of that same transistor, while another transistor may be body biased as N3 in FIG. 5—that is, with a tie to a reference voltage node (which may be fixed or variable) other than a terminal of the transistor being biased.

The particle tracks shown in FIG. 1 are normal to the MOSFET's silicon surface. As described above, the particles can traverse the MOSFET in any direction, so it is possible for a particle to travel horizontally through the MOSFET silicon of FIG. 1, thus traversing two stacked transistors. If that happens to both of the N-channel transistors of FIG. 4, for example, the response would be the same as that described above for the non-hardened inverter of FIG. 2. However, the solid angle that includes a track through both MOSFETs is orders of magnitude less than the solid angle that provides a track through any one MOSFET. By thus restricting the solid angle through which a particle must pass to cause a SET, the probability of a SET can be greatly reduced.

For example, a typical SOI process may yield a silicon thickness of 0.2 $\mu$m and a transistor width of 2 $\mu$m. The resulting two angles of interest are:

Arctangent of (0.2/2)=5.7° and

Arctangent of (2.0/2)=45° which yields a solid angle that is $1/126^{th}$ the size of the solid angle around a single MOSFET that is vulnerable to SET. Increasing the separation between the two MOSFETs in the hardened circuit will further reduce the solid angle of vulnerability.

Exemplary embodiments of the present invention have been illustrated and described. It will be understood, however, that changes and modifications may be made to the invention without deviating from the spirit and scope of the invention, as defined by the following claims.

I claim:

1. A radiation-hardening circuit comprising:

a first transistor of a given transistor type having a source terminal, a gate terminal, a drain terminal, and a body terminal;

a resistor having a first node and a second node, wherein the first node of the resistor is conductively coupled to an output node and wherein the second node of the resistor is conductively coupled to the body terminal of the first transistor, the body terminal of the first transistor having no further connection to any gate, drain, source, or body terminal of any other transistor; and a second transistor of a same transistor type as the first transistor having a source terminal, a gate terminal, a drain terminal, and a body terminal, wherein the drain terminal of the second transistor is conductively coupled to the source terminal of the first transistor and the gate terminal of the second transistor is conductively coupled to the gate terminal of the first transistor.

2. The circuit of claim 1, wherein the output node is the drain terminal of the first transistor.

3. The circuit of claim 1, wherein the first transistor and the second transistor are N-channel field effect transistors (FETs).

4. The circuit of claim 2, wherein the first transistor and the second transistor are N-channel FETs.

5. The circuit of claim 3, wherein the first transistor and the second transistor in combination replace any single N-channel FET for which hardening is required.

6. The circuit of claim 1, wherein the first transistor and the second transistor are P-channel FETs.

7. The circuit of claim 2, wherein the first transistor and the second transistor are P-channel FETs.

8. The circuit of claim 6, wherein the first transistor and the second transistor in combination replace any single P-channel FET for which hardening is required.

9. The circuit of claim 3, wherein the source terminal of the second transistor is conductively coupled to a reference potential, and wherein the drain terminal of the first transistor comprises the output of the circuit.

10. The circuit of claim 4, wherein the source terminal of the second transistor is conductively coupled to a reference potential, and wherein the drain terminal of the first transistor comprises the output of the circuit.

11. The circuit of claim 6, wherein the source terminal of the second transistor is conductively coupled to a reference potential, and wherein the drain terminal of the first transistor comprises the output of the circuit.

12. The circuit of claim 7, wherein the source terminal of the second transistor is conductively coupled to a reference potential, and wherein the drain terminal of the first transistor comprises the output of the circuit.

13. A radiation-hardening inverter circuit comprising:

a first transistor having a source terminal, a gate terminal, a drain terminal, and a body terminal;

a first resistor having a first node and a second node, wherein the first node of the first resistor is conductively coupled to the drain terminal of the first transistor and the second node of the first resistor is conductively coupled to the body terminal of the first transistor, the body terminal of the first transistor having no further connection to any gate, drain, source, or body terminal of any other transistor;

a second transistor having a source terminal, a gate terminal, a drain terminal, and a body terminal, wherein the drain terminal of the second transistor is conductively coupled to the source terminal of the first transistor and the gate terminal of the second transistor is conductively coupled to the gate terminal of the first transistor;

a third transistor having a source terminal, a gate terminal, a drain terminal, and a body terminal, wherein the drain terminal of the third transistor is conductively coupled to the drain terminal of the first transistor, the drain terminal of the third transistor comprising the sole output of the inverter circuit;

a second resistor having a first node and a second node, wherein the first node of the second resistor is conductively coupled to the drain terminal of the third transistor and the second node of the second resistor is conductively coupled to the body terminal of the third transistor, the body terminal of the third transistor having no further connection to any gate, drain, source, or body terminal of any other transistor; and a fourth transistor having a source terminal, a gate terminal, a drain terminal, and a body terminal, wherein the drain terminal of the fourth transistor is conductively coupled to the source terminal of the third transistor and the gate terminal of the fourth transistor is conductively coupled to the gate terminal of the third transistor, and to the gate terminals of the first and second transistors, the interconnected gate terminals comprising the input of the inverter circuit.

14. A radiation-hardening circuit comprising:

a first transistor of a given transistor type having a source terminal, a gate terminal, a drain terminal, and a body terminal;

a resistor having a first node and a second node, wherein the first node of the resistor is conductively coupled to the drain terminal of the first transistor and wherein the second node of the resistor is conductively coupled to the body terminal of the first transistor, the body terminal of the first transistor having no further connection to any gate, drain, source, or body terminal of any other transistor; and a second transistor of a same transistor type as the first transistor having a source terminal, a gate terminal, a drain terminal, and a body terminal;

wherein the drain terminal of the second transistor is conductively coupled to the source terminal of the first transistor, the gate terminal of the second transistor is conductively coupled to the gate terminal of the first transistor, and wherein the body terminal of the second transistor is conductively coupled to the source of the second transistor.

15. A radiation-hardening circuit comprising:

a first transistor having a source terminal, a gate terminal, a drain terminal, and a body terminal;

a first resistor having a first node and a second node, wherein the first node of the first resistor is conductively coupled to the drain terminal of the first transistor and the second node of the first resistor is conductively coupled to the body terminal of the first transistor, the body terminal of the first transistor having no further connection to any gate, drain, source, or body terminal of any other transistor;

a second transistor having a source terminal, a gate terminal, a drain terminal, and a body terminal, wherein the drain terminal of the second transistor is conductively coupled to the source terminal of the first transistor, the gate terminal of the second transistor is conductively coupled to the gate terminal of the first transistor, and the body terminal of the second transistor is conductively coupled to a reference node;

a third transistor having a source terminal, a gate terminal, a drain terminal, and a body terminal, wherein the drain terminal of the third transistor is conductively coupled to the source terminal of the second transistor;

a second resistor having a first node and a second node, wherein the first node of the second resistor is conductively coupled to the drain terminal of the first transistor and the second node of the second resistor is conductively coupled to the body terminal of the third transistor, the body terminal of the third transistor having no further connection to any gate, drain, source, or body terminal of any other transistor; and a fourth transistor having a source terminal, a gate terminal, a drain terminal, and a body terminal, wherein:

the drain terminal of the fourth transistor is conductively coupled to the source terminal of the third transistor;

the gate terminal of the fourth transistor is conductively coupled to the gate terminal of the third transistor, and to the gate terminals of the first and second transistors, the interconnected gate terminals comprising the input of the circuit;

the source terminal of the fourth transistor is conductively coupled to the reference node; and the body terminal of the fourth transistor is conductively coupled to the source terminal of the fourth transistor.

* * * * *